United States Patent
Moy

[11] 3,983,504
[45] Sept. 28, 1976

[54] ACTIVE FILTER

[76] Inventor: Franklin Moy, 2038 Cunningham Drive, Hampton, Va. 23666

[22] Filed: Nov. 21, 1975

[21] Appl. No.: 627,303

[52] U.S. Cl. .............................. 330/107; 330/108; 330/109; 333/70 CR
[51] Int. Cl.² ......................................... H03F 1/36
[58] Field of Search ............ 328/167; 330/107, 108, 330/109; 333/70 CR

[56] References Cited
UNITED STATES PATENTS

| 3,509,482 | 4/1970 | Guillemin | 330/107 |
| 3,670,254 | 6/1972 | Barzely | 330/107 |
| 3,742,391 | 6/1973 | Smith | 333/70 CR X |

Primary Examiner—R. V. Rolinec
Assistant Examiner—Lawrence J. Dahl
Attorney, Agent, or Firm—Frederick W. Turnbull

[57] ABSTRACT

An improved filtering circuit connected to the inverting terminal of an operational amplifier having connected in parallel a first resistor and three series capacitors. Two series resistors are connected in parallel with the center capacitor and the junction between the two series resistor is connected to a fixed potential.

9 Claims, 3 Drawing Figures

ACTIVE FILTER

BACKGROUND OF THE INVENTION

1. Field of the Invention

The present invention relates generally to electrical filter and more specifically to an improved RC active filter.

2. Description of the Prior Art

The RC active filters of the prior art have required an excess of parts to provide the performance characteristics required. Also, active RC filters had to be individually designed for each application. The filtering RC circuits are individually designed specifically for low pass, high pass, band pass, notch, etc., use.

SUMMARY OF THE INVENTION

The circuit of the present invention overcomes the problems of the prior art by providing an RC filtering circuit which can be used with a differential operational amplifier to provide band pass or notch filtering. The RC filtering circuit includes the parallel combination of a first resistor and three series connected capacitors. A second and third resistor, connected in series, are in parallel with the middle capacitor and the junction between the second and third resistor is connected to a fixed potential. The RC circuit, with a fourth capacitor in parallel with the first resistor, is connected between the output of a differential operational amplifier and the inverting input to produce an active band pass filter. The same RC circuit can be connected between the signal input and the inverting input of a differential operational amplifier to produce an active notch filter.

The fixed potential may be ground or the plus or minus reference voltage of the operational amplifier. The second and third resistors may be individual resistors or a potentiometer. Preferably, the three series capacitors are of equal value and the value of the first resistor is six times the sum of the value of the second and third resistors. Thus the center frequency of the filter is:

$$f = \frac{1}{2\pi C \sqrt{3 R_2 R_3}}$$

where
C is the value of the equal series capacitors in microfarads;
$R_2$ is the value of the second resistor in ohms;
$R_3$ is the value of the third resistor in ohms.

By adjusting the values of $R_2$ and $R_3$, the center frequency is readily changed.

OBJECTS OF THE INVENTION

An object of the present invention is to provide an improved RC filtering circuit for an active filter with a minum number of parts.

Another object is to provide an Rc filtering circuit which may be used for more than one type of active filtering.

A still further object of the present invention is to provide an RC filtering circuit whose center frequency is readily calculable and adjustable.

Other objects, advantages, and novel features of the present invention will become apparent from the following detailed description of the invention when considered in conjunction with the accompanying drawings.

DESCRIPTION OF THE PREFERRED EMBODIMENTS

Figure 1:
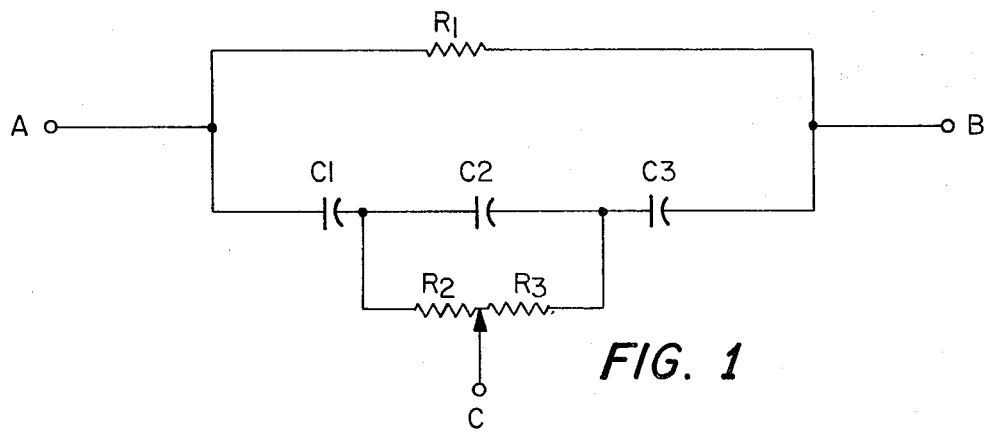
FIG. 1 is a schematic representation of a preferred embodiment of the RC filter circuit of the present invention.

As illustrated in FIG. 1, the RC filter circuit of the present invention is illustrated as having terminals, A, B and C. The concept of the filtering circuit is to provide a resistance path between terminals A and B which varies sharply as a function of frequency of the input signal at terminals A or B. As is well known, the frequency at which the resistance is highest is known as the center frequency. A preferred embodiment of the filtering circuit includes a resistor $R_1$ in parallel with the series connection of three capacitors $C_1$, $C_2$ and $C_3$. Connected across the center capacitor $C_2$ is a potentiometer illustrated as resistors $R_2$ and $R_3$ whose value are determined by a slide connected to terminal C. Though the resistors $R_2$ and $R_3$ are illustrated as a potentiometer with a wiper, it should be noted that $R_2$ and $R_3$ may be two separate resistors wherein the junction between the two resistors is connected to the terminal C.

Main terminals A and B are connected in the circuit with differential operational amplifier whereas terminal C is connected to a fixed potential. The fixed potential for terminal C may be ground, or the positive or negative reference voltages for the operational amplifier. The center frequency for the RC filtering circuit of FIG. 1 may be expressed or calculated as follows:

$$f = \frac{1}{2\pi C \sqrt{3 R_2 R_3}}$$

where
C is the value of one of the equal valued capacitors ($C_1 = C_2 = C_3$) in microfarads;
$R_2$ is the value of one part of the potentiometer in ohms;
$R_3$ is the value of the remainder of the potentiometer in ohms; and
$R_1$ is six times the sum of $R_2$ and $R_3$.

From the above formula it is obvious that by changing the values of $R_2$ and $R_3$ the center frequency of the filtering circuit may be varied. Using a potentiometer with a wiper as shown in FIG. 1, the center frequency is readily and easily varied. Making the values of $C_1$ and $C_2$ and $C_3$ equal and by selecting the value of $R_1$ to be equal to six times the sum of $R_2$ and $R_3$, a filtering circuit of high performance with a minimum number of parts is produced.

Figure 2:
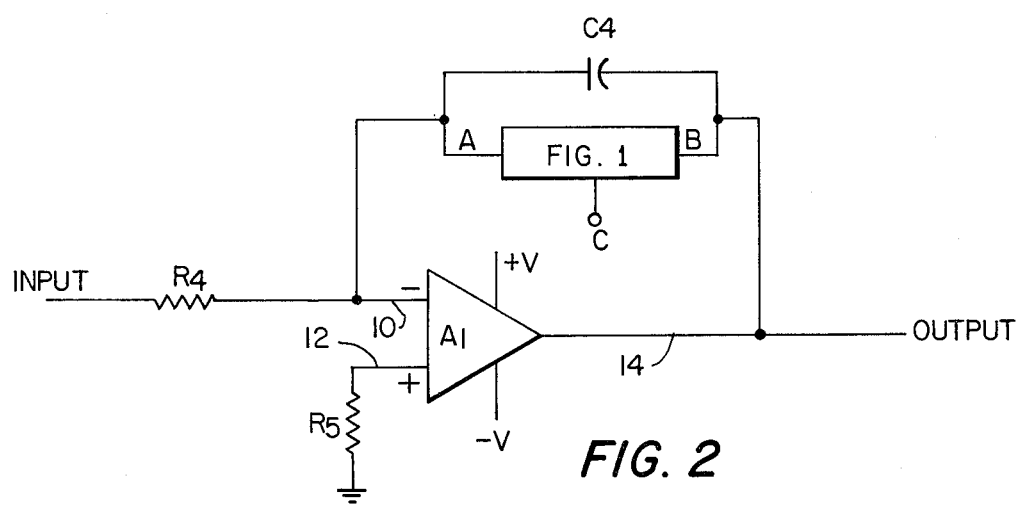
FIG. 2 is a schematic representation of the RC filter circuit of FIG. 1 connected to a differential operational amplifier to produce an active band pass filter.

Filtering circuit of FIG. 1 may be used with a differential operational amplifier to produce a band pass filter as illustrated in FIG. 2. The operational amplifier in FIG. 1 has an inverting input 10 and noninverting input 12 and output 14 and plus and minus reference voltage terminals. The input signals applied to the inverting input through a resistor $R_4$. A resistor $R_5$ connects the noninverting input 12 to ground. Connected between the output terminal 14 and the inverting input 10 is the filtering circuit of FIG. 1. Connected across terminals A and B of the filtering circuit of FIG. 1 is a capacitor $C_4$. In normal operation, the input signal through resistor $R_4$ is amplified to the output terminal 14. The path between points A and B has a low resistance such that heavy negative feedback flows from the output to the input. This results in a very small signal at the output terminal 14. If the input signal has a frequency of the center frequency of the network of FIG. 1, the impedance path between A and B is very high and consequently minimizes or cuts off the negative feedback. Consequently the output signal is greatly amplified at the center frequency.

The resistor $R_4$ controls the gain of the band pass filter whereas resistor $R_5$ biases the current circuit for the operational amplifier A1. The capacitor $C_4$, connected across the circuit of FIG. 1, stabilizes the circuit and controls, to a certain extent, the band width of the band pass filter. As explained previously, terminal C may be connected to ground as resistor $R_4$ or the plus or minus terminal of the operational amplifier. Thus it can be seen that the operational amplifier of FIG. 2 may be connected in a feedback relationship to the inverting terminal of the differential operational amplifier and cause the amplifier to operate as an active band pass filter.

Figure 3:
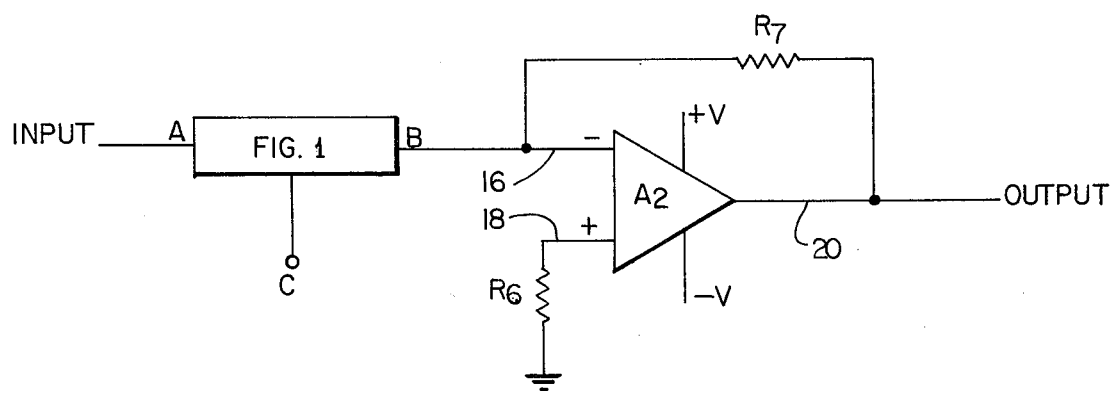
FIG. 3 is a schematic representation of the RC filter circuit of FIG. 1 connected to a differential operational amplifier to produce an active notch filter.

As illustrated in FIG. 3, the filtering circuit of FIG. 1 may be connected to an operational amplifier so as to operate the operational amplifier as an active notch filter. The differential operational amplifier A2 has an inverting input terminal 16 and noninverting input terminal 18 and output terminal 20. A resistor $R_6$ connects the noninverting input terminal to ground and a resistor $R_7$ connects the output 20 to the noninverting input 16. The terminals A and B filtering circuit of FIG. 1 is connected between the signal input and the inverting input 16 of the operational amplifier A2. The circuit of FIG. 1 has a high impedance between terminals A and B at the center frequency and has low impedance between terminals A and B at other than the center frequency. As in FIG. 2, terminal C may be connected to the ground as resistor $R_6$ or to the plus and minus reference voltages of the operational amplifier A2.

The input signal to terminal A at other than the center frequency is transmitted on unattenuated to the inverting input 16 of amplifier A2 where it is amplified and presented to the output terminal 20. At the center frequency the input signal is greatly attenuated by the high impedance between the terminals A and B. Consequently at the output terminal 20 of the amplifier is greatly reduced. Thus, the circuit of FIG. 3 provides an active notch filter with the filtering circuit of FIG. 1 placed between the signal input and the inverting input terminal of an operational amplifier. The resistor $R_6$ provides the bias current for the operational amplifier A2 and the resistor $R_7$ provides gain control for the notch filter.

Thus it can be seen that the simple, readily adjustable filtering circuit of FIG. 1 may be connected to an operational amplifier in at least two different configuratiions to produce two different types of filters. The selection of values $R_2$ and $R_3$ by the wiper on a potentiometer or two different variable resistors provides a filtering circuit which is readily adjustable and whose value is easily calculated.

From the preceding description of the preferred embodiment, it is evident that the objects of the invention are attained and although the invention has been described and illustrated in detail, it is to be clearly understood that the same is by way of illustration and example only and is not to be taken by way of limitation. The spirit and scope of this invention being limited only by the terms of the appended claims.

What is claimed is:

1. In an active filter having an operational amplifier means with an inverting input terminal, a noninverting input terminal and an output terminal and a filtering means connected between said output terminal and said inverting input terminal, the improved filtering means comprising:

a first resistor means;

a first, second and third capacitor means connected in series and said series connected capacitor means being connected in parallel with said first resistive means;

a second and third resistive means connected in parallel with said second capacitive means; and the junction point of said second and third resistive means being connected to a fixed potential.

2. The active filter of claim 1 wherein said second and third resistive means are a potentiometer having its wiper connected to said fixed potential.

3. The active filter of claim 1 wherein said filtering means includes a fourth capacitive means connected in parallel with said first resistive means.

4. The active filter of claim 1 wherein said first, second and third capacitive means are of the same value.

5. The active filter of claim 1 wherein said first resistive means is six times the sum of said second and third resistive means.

6. In an active filter having an operational amplifier with an inverting input terminal, a noninverting input terminal and an output terminal and a filtering means connected between the input of the active filter and said inverting input terminal, the improved filtering means comprises:

a first resistor means;

a first, second and third capacitor means connected in series and said series connected capacitor means being connected in parallel with said first resistive means;

a second and third resistive means connected in parallel with said second capacitive means; and the junction point of said second and third resistive means being connected to a fixed potential.

7. The active filter of claim 6 wherein said second and third resistive means are a potentiometer having its wiper connected to said fixed potential.

8. The active filter of claim 6 wherein said first resistive means is six times the sum of said second and third resistive means.

9. The active filter of claim 6 wherein said first, second and third capacitive means are of the same value.

* * * * *